United States Patent
Haase

(10) Patent No.: US 9,831,427 B1
(45) Date of Patent: Nov. 28, 2017

(54) ION-BARRIER FOR MEMRISTORS/RERAM AND METHODS THEREOF

(71) Applicant: National Technology & Engineering Solutions of Sandia, LLC, Albuquerque, NM (US)

(72) Inventor: Gad S. Haase, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 14/829,440

(22) Filed: Aug. 18, 2015

Related U.S. Application Data

(60) Provisional application No. 62/040,335, filed on Aug. 21, 2014.

(51) Int. Cl.
*H01L 45/00* (2006.01)

(52) U.S. Cl.
CPC ............ *H01L 45/12* (2013.01); *H01L 45/141* (2013.01); *H01L 45/146* (2013.01); *H01L 45/1608* (2013.01)

(58) Field of Classification Search
CPC ........ H01L 45/14–45/148; H01L 45/12; H01L 45/141; H01L 45/146; H01L 45/1608
USPC .................. 257/2, 4, 613; 438/190; 365/148
See application file for complete search history.

(56) References Cited

U.S. PATENT DOCUMENTS

| | | | |
|---|---|---|---|
| 7,129,133 B1 | 11/2006 | Avanzino et al. | |
| 8,415,652 B2 | 4/2013 | Yang et al. | |
| 8,455,852 B2 | 6/2013 | Quitoriano et al. | |
| 8,575,585 B2 | 11/2013 | Yang et al. | |
| 2011/0266513 A1* | 11/2011 | Williams | G11C 13/0007 257/4 |
| 2012/0104347 A1 | 5/2012 | Quick | |
| 2013/0221307 A1 | 8/2013 | Wang et al. | |
| 2014/0091270 A1* | 4/2014 | Yang | H01L 45/04 257/4 |
| 2014/0183432 A1* | 7/2014 | Barabash | H01L 45/08 257/2 |

OTHER PUBLICATIONS

Chhowalla M et al., "The chemistry of two-dimensional layered transition metal dichalcogenide nanosheets," *Nat. Chem.* Apr. 2013;5:263-75.

Franzen HF et al., "The group IV di-transition metal sulfides and selenides," *Mater. Res. Bull.* 1967;2:1087-92.

Keszler DA et al., "New ternary and quaternary transition-metal selenides: Syntheses and characterization," *J. Solid State Chem.* 1985;57:68-81.

(Continued)

*Primary Examiner* — Bo Fan
(74) *Attorney, Agent, or Firm* — Martin I. Finston

(57) ABSTRACT

The present invention relates to memristive devices including a resistance-switching element and a barrier element. In particular examples, the barrier element is a monolayer of a transition metal chalcogenide that sufficiently inhibits diffusion of oxygen atoms or ions out of the switching element. As the location of these atoms and ions determine the state of the device, inhibiting diffusion would provide enhanced state retention and device reliability. Other types of barrier elements, as well as methods for forming such elements, are described herein.

10 Claims, 5 Drawing Sheets

(56) References Cited

OTHER PUBLICATIONS

Lee MJ et al., "A fast, high-endurance and scalable non-volatile memory device made from asymmetric $Ta_2O_{5-x}/TaO_{2-x}$ bilayer structures," *Nat. Mater.* Aug. 2011;10:625-30.
Mehonic A et al., "Electrically tailored resistance switching in silicon oxide," *Nanotechnology* 2012;23:455201 (9 pp.).
Shimada T et al., "Polytypes and crystallinity of ultrathin epitaxial films of layered materials studied with grazing incidence X-ray diffraction," *Surf Sci.* 1996;369:379-84.
Wang QH et al., "Electronics and optoelectronics of two-dimensional transition metal dichalcogenides," *Nat. Nanotechnol.* Nov. 2012;7:699-712.
Wang S et al., "Synthetic fabrication of nanoscale $MoS_2$-based transition metal sulfides," *Materials* 2010;3:401-33.
Wold A et al., "Low temperature synthesis of transition metal sulfides," *J. Solid State Chem.* 1992;96:53-8.
Wong HSP et al., "Metal-oxide RRAM," *Proc. IEEE* Jun. 2012;100(6):1951-70.
Yang JJ et al., "Memristive devices for computing," *Nat. Nanotechnol.* Jan. 2013;8:13-24.
Yang JJ et al., Supplementary information for "Memristive devices for computing," *Nat. Nanotechnol.* Jan. 2013;8:13-24 (10 pp.).

\* cited by examiner

US 9,831,427 B1

ION-BARRIER FOR MEMRISTORS/RERAM AND METHODS THEREOF

CROSS-REFERENCE TO RELATED APPLICATION

This application claims the benefit of U.S. Provisional Application No. 62/040,335, filed Aug. 21, 2014, which is hereby incorporated by reference in its entirety.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to memristive devices including a resistance-switching element and a barrier element. In particular examples, the barrier element includes a transition metal chalcogenide that sufficiently inhibits diffusion of oxygen atoms or ions out of the switching element. Other types of barrier elements, as well as methods for forming such elements, are described herein.

BACKGROUND OF THE INVENTION

A resistance-switching element is a circuit element whose electrical resistance is determined by its previous current-voltage history in such a way that an applied voltage of sufficient magnitude can switch it between a high-conductance state and a low-conductance state. The terms "memristor" or "resistive random access memory" (ReRAM or RRAM) is often used to refer to a passive two-terminal resistance-switching element fabricated with a thin insulating film sandwiched between two conductors.

Memristors are among the most promising emerging memory devices to replace flash, DRAM, and possibly SRAM. The desirable analog behavior of memristors may also make them a candidate for neuromorphic circuit applications. Currently known types of memristors are believed to work because large-signal voltages (typically >1 V) across the device may be used to shift the spatial distribution of ions in the insulator, which in turn acts to change the small-signal (typically <1 V) resistance of these devices.

The insulating materials used until now in memristors are generally transition metal oxides (TMO) (e.g., as films) containing mobile oxygen ions and oxygen vacancies, such as $TiO_2$, $Ta_2O_5$, $WO_3$, $HfO_2$, NiO, and $Nb_2O_5$. Electrodes are typically made from electrically conductive metals. In many instances, a pair of metals is favored for the respective electrodes, in which one metal more readily reduces the insulator material than the other.

Control of mobile oxygen ions and oxygen vacancies is key for providing a stable memristor. Switching between states in a memristor involves the formation of oxygen vacancies in the TMO film by oxygen transfer into or from the active metal electrode. This oxygen transfer step requires minimal energy. For this reason, resistive memory devices exhibit beneficial, low power consumption for read/write operations. However, the lack of an energy barrier also gives rise to the very low reliability (e.g., low endurance and state retention) observed in these devices so far. It may also give rise to some forms of random noise in the reading of the device state. Thus, there is a need for additional methods and components to control these mobile species in order to increase reliability, state retention, endurance, and/or reduce noise in memristive devices.

SUMMARY OF THE INVENTION

Accordingly, the present invention relates to memristive devices including a resistance-switching element and a barrier element. In particular embodiments, the barrier element includes a transition metal chalcogenide or dichalcogenide (e.g., a transition metal sulfide, disulfide, selenide, or diselenide) that sufficiently inhibits diffusion of oxygen atoms or ions between the switching element and the reactive electrode (e.g., the electrode with the highest affinity to oxygen). As the location of these atoms and ions determine the state of the device, inhibiting diffusion would provide enhanced state retention and device reliability.

Definitions

As used herein, the term "about" means+/−10% of any recited value. As used herein, this term modifies any recited value, range of values, or endpoints of one or more ranges.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

BRIEF DESCRIPTION OF THE DRAWINGS

FIG. 1A is a schematic view of an exemplary memristive device 100 having a barrier element 110 and a resistance-switching element 120 disposed between two conductive elements 130, 135;

FIG. 1B is a schematic view of an exemplary memristive device 150 and steps to electroform 151, set 152, and reset 153 the device; and FIG. 1C is a schematic view of a non-limiting, proposed switching mechanism between a high resistance state 170 (or "OFF" state) and a low resistance state 180 (or "ON" state).

DETAILED DESCRIPTION OF THE INVENTION

The present invention relates to memristive devices having a barrier element (e.g., any described herein). In general, switching in a memristive device relies on a mobile species, either a mobile oxygen atom/ion or mobile oxygen vacancy. Switching between two states (e.g., ON and OFF states, as described herein) requires an applied voltage, which results in movement of the mobile species. State retention, i.e., retention of the ON and/or OFF state, depends, in part, on the energy barrier for such movement. Accordingly, the present invention includes use of a barrier element to increase that energy barrier, thereby prolonging and/or retaining the device in the desired state. The invention is also aimed at lowering "random telegraph noise" during a particular state read, which stems from random thermal motion of single oxygen atoms between the reactive electrode (that absorbs oxygen) and the resistance-switching dielectric element.

In particular embodiments, the barrier element includes a non-oxygen chalcogen (e.g., S, Se, or Te) that binds to a transition metal to a greater extent than between an oxygen atom and that same transition metal. Thus, the bond energy between the transition metal and non-oxygen chalcogen ($E_{M-X}$) can be greater than the bond energy between that same transition metal and oxygen ($E_{M-O}$), i.e., $E_{M-X} > E_{M-O}$. By increasing the energy barrier for oxygen atom or ion drift, greater state retention and/or lower noise can be obtained. Additional details of memristive devices, related components, and methods thereof follow.

Memristive Devices and Methods Thereof

In general, the memristive device of the invention includes at least two conductive elements, a resistance-switching element disposed between the conductive elements, and a barrier element that is disposed between the resistance-switching element and at least one conductive element. In particular embodiments, the resistance-switching element includes one or more conductive filaments disposed within the bulk of the switching element.

A filament is generally configured as a conduction path formed by localized defects within the bulk material of the switching element. Exemplary defects include atom vacancies or metal precipitates, and can be formed by any useful process (e.g., an electroforming process, as described herein). Without wishing to be limited by mechanism, motion of mobile species (e.g., mobile positively-charged oxygen vacancies, mobile positively-charged metallic ions, and/or mobile negatively-charged oxygen anions) modulates the resistance of the conduction path, and it is believed that the presence of a barrier element will further prolong a particular resistance state of the device.

Figure 1A:
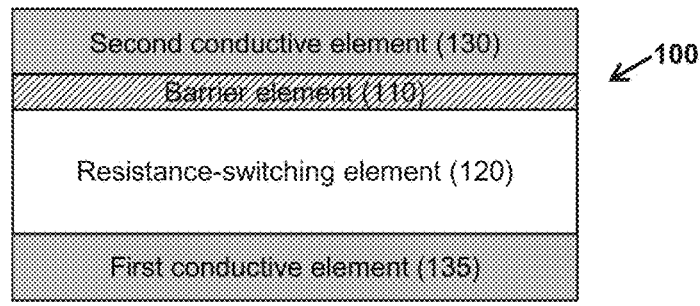
FIGS. 1A-1C show schematics of exemplary memristive devices and their non-limiting switching mechanisms. Provided are.

FIG. 1A provides a cross-sectional view of an exemplary device 100, which includes a second conductive element 130 (e.g., a top electrode), a barrier element 110, a resistance-switching element 120, and a first conductive element 135 (e.g., a bottom electrode). Optionally, the memristor can be formed on a substrate, e.g., of highly doped silicon, and electrical contact can be made to the back side of substrate by means of a contact layer (e.g., an aluminum contact layer or an electrode layer).

The device can have any other useful component. For instance, adhesion layers may be present in the device, e.g., between the resistance-switching element and the conductive element. Exemplary adhesion layers include titanium nitride. Although each element of the exemplary device 100 is provided as a planar layer, a skilled artisan would understand that any useful, different geometry and arrangement for each element can be employed. For instance, the electrodes can be configured to be located on the same plane and separated by a gap, where the gap is filled with the resistance-switching element. In another instance, the top and bottom electrodes can be longitudinal bars located in different planes and having a longitudinal axis orthogonal to one another (e.g., such as in a crossbar array). In yet another instance, instead of a two-terminal device, the memristive device can be a three-terminal device in which a third electrode is used as a gate. Optionally, one or more buffer layers can be present between the resistance-switching element and the conductive element(s).

In yet another instance, a capping layer can be present (e.g., between the barrier element and the resistance-switching element). For instance, the capping layer can include a material that depletes mobile species (e.g., single oxygen atoms or ions) from the resistance-switching element and acts as a reservoir for mobile species. Exemplary materials for the capping layer includes, e.g., Ti, TiN, Ta, Hf, etc. A capping layer can be formed by any useful process, such as post-deposition annealing.

Figure 1B:
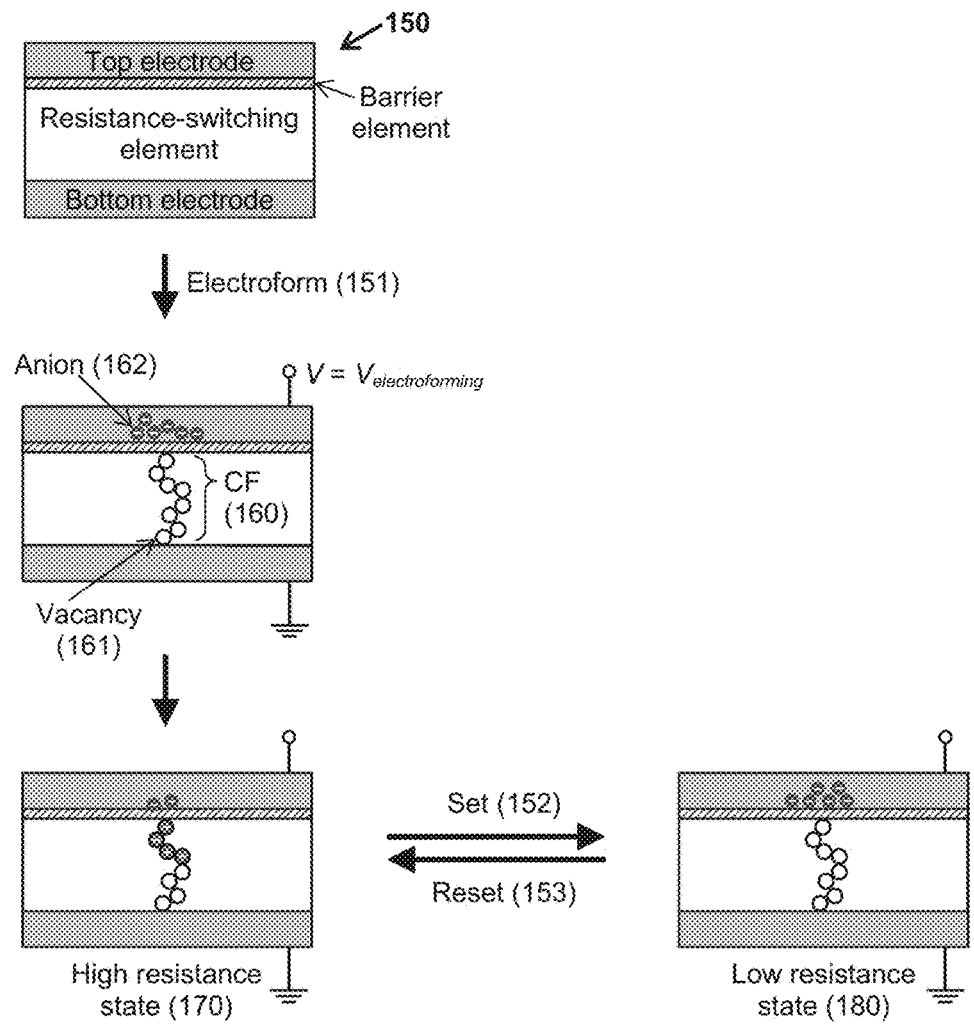

The memristive device can be formed and employed in any useful manner. For example, as shown in FIG. 1B, the device 150 can include a top electrode, an active region including a barrier element and a resistance-switching element, and a bottom electrode. The electrodes and active regions can include continuous layers (e.g., as a stack having each layer in continuous contact with another layer) or discontinuous layers (e.g., where at least a portion of one layer contacts only a portion of another layer).

After fabricating the device, one or more additional steps can be performed. For instance, electroforming is a known technique to condition newly fabricated memristive devices so as to fix their final high resistance state (HRS) and low resistance state (LRS). An electroforming step is often required prior to memristors settling into their final resistance range. In general, the electroforming voltage $V_{electroforming}$ will be greater than the switching voltage (e.g., the set voltage $V_{set}$ or reset voltage $V_{reset}$). Electroform-free devices or those having reduced requirements for $V_{electroforming}$ can also be envisioned. For instance, devices having thinner resistance-switching elements (e.g., on the order of 1-10 nm) require a reduced $V_{electroforming}$. In another non-limiting instance, devices can be annealed during the step of depositing the resistance-switching material, where this annealing process can also further reduce $V_{electroforming}$. Other methods of including local defects in the resistance-switching element can be employed to minimize the required electroforming voltage to instill a conducting filament. Reducing $V_{electroforming}$ can be beneficial to improve device-to-device repeatability and to reduce device unpredictability.

As shown in FIG. 1B, after fabricating the device 150, an electroforming step 151 is used to initiate the resistance-switching cycles present in memristive devices. This step includes applying an electroforming voltage $V_{electroforming}$ across the device in order to instill localized defects within the bulk of the resistance-switching element, thereby providing a conducting filament CF 160 composed of defects or vacancies 161. Atoms or ions knocked out of the lattice (e.g., anions 162) generally drift to one of the electrodes (e.g., the anode).

In one embodiment, electroforming the device includes using a positive voltage sweep (e.g., of from about 0 V to about +2.5 V) with a current compliance (e.g., selected in the range of about 0.05 mA to about 0.5 mA). The current compliance is a specified ceiling on the absolute value of the current that can be supplied. The electroforming step can be used to switch the device from a high resistance state (HRS) to a medium resistance state (MRS), which we identify as the OFF state. A negative sweep then switches the device to a low resistance state (LRS), which we identify as the ON state.

Figure 1C:
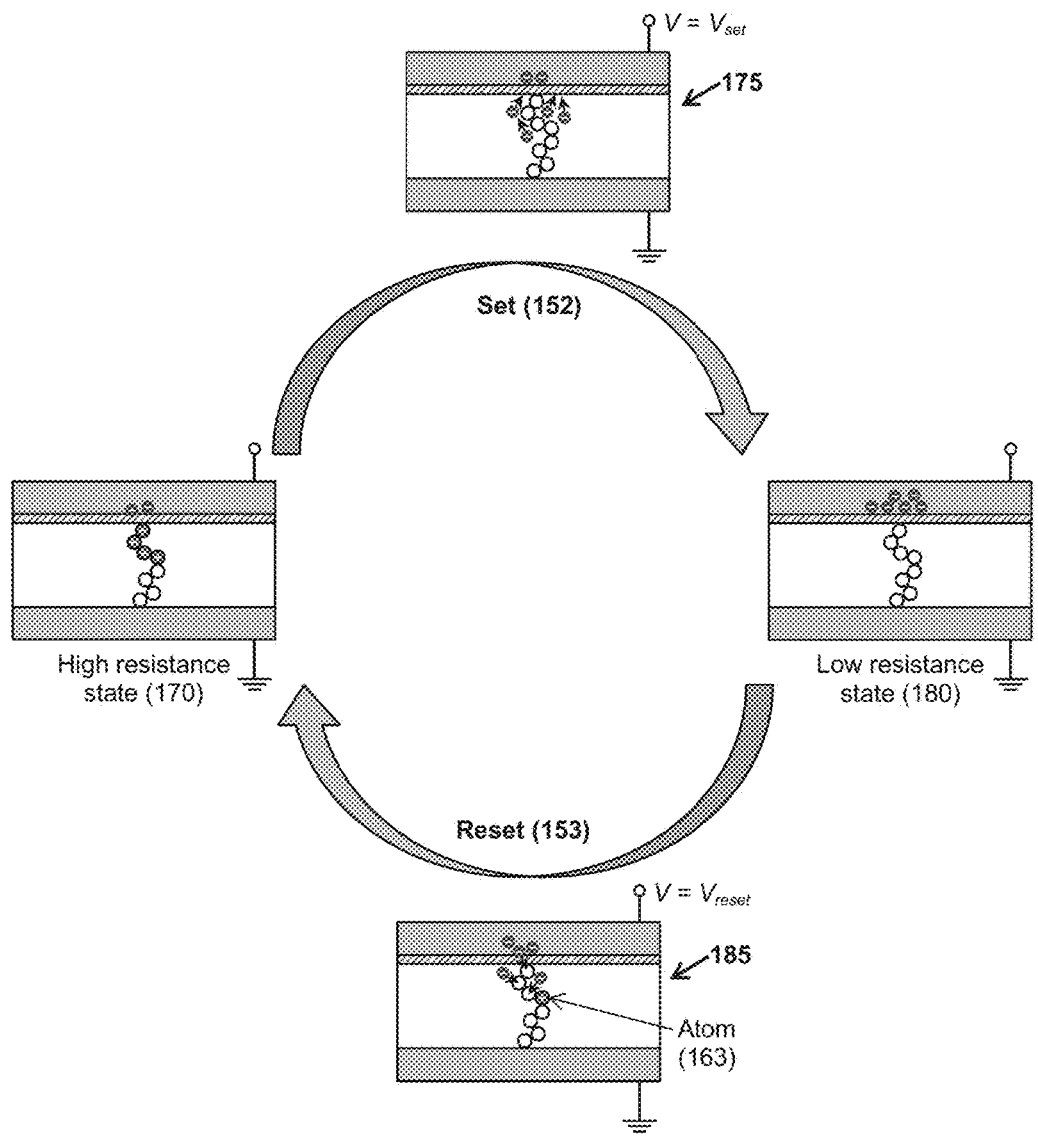

Upon forming the conductive filament(s), the device can be switched between a high resistance state (HRS) 170 and a low resistance state (LRS) 180 (FIG. 1B-1C). These states can be used to store OFF and ON states (e.g., Boolean 0 and 1 states), which allows for information storage. In particular embodiments, the HRS corresponds to an OFF state, and the LRS corresponds to an ON state.

Switching includes a set process 152, as well as a reset process 153. The set and reset processes generally require an applied voltage of a sufficient amplitude to toggle between the HRS and the LRS. When switching between these two states occurs irrespective of voltage polarity, then the device is a unipolar switch. When switching depends on the polarity of the applied voltage (e.g., a positive voltage to set and a negative voltage to reset), then the device is a bipolar switch. Both unipolar and bipolar switches are encompassed by the present invention.

As shown in FIG. 1C, the barrier element interacts with the mobile species during the set 152 and reset 153 processes. When a device is reset 153, the mobile species in the device 185 move towards the conductive filament, where the combination of the mobile species and a vacancy can form an atom 163. When a device is set 152, the mobile species in the device 175 move towards the barrier element and the top electrode. These mobile species interact with the barrier element and, if the barrier element impedes species movement into the electrode, then the desired resistance state of the device can be retained. Any mobile species can be blocked or deterred (e.g., decrease the rate or speed of drift under an electric field). Exemplary mobile species includes atoms or ions, such as oxygen ions, nitrogen ions, or metal ions (e.g., Ag or Cu ions).

Figure 2:
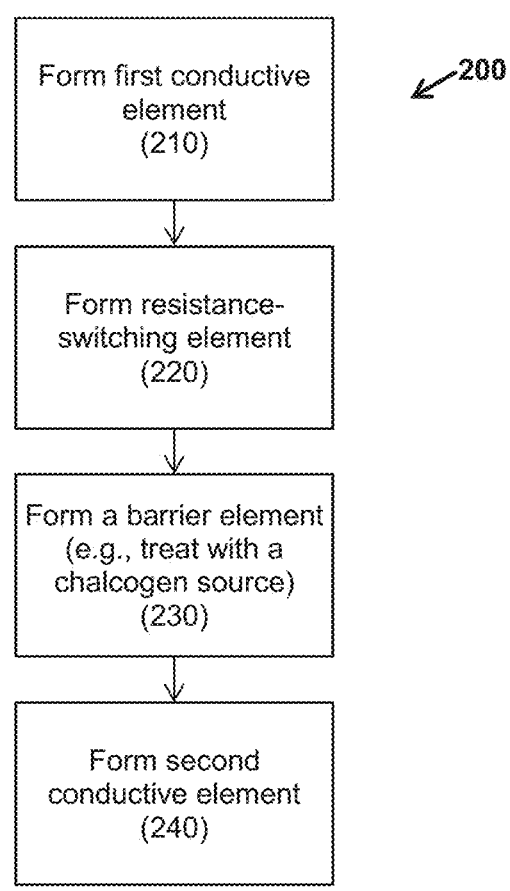
FIG. 2 is a schematic of an exemplary method 200 that includes forming a barrier element 230 in a memristive device.

The device can be formed by any useful method. As shown in FIG. 2, an exemplary method 200 includes forming a first conductive element 210, forming a resistance-switching element 220, forming a barrier element 230 (e.g., by treating with a chalcogen source, such as a source for S, Se, and/or Te), and forming a second conductive element 240. Additional steps can be performed, such as annealing, electroforming, polishing (e.g., chemical mechanical polishing), etc.

The first and second conductive elements can be formed from any useful material (e.g., any herein). Optionally, step 210 of forming a first conductive element includes forming this element on a substrate (e.g., a silicon substrate, including doped forms thereof). In particular embodiments, the first and second conductive elements are formed, e.g., by sputtering a metal.

Forming the resistance-switching element can include any useful material and process (e.g., as described herein). As described herein, the switching element generally includes an insulator and, optionally, forming this element can include a step of implanting one or more defects (e.g., oxygen atoms or ion) into the bulk material. Alternatively, step 220 of forming the switching element can include forming a primary material on a surface and then forming a secondary material (e.g., including one or more dopants) disposed on top of a surface of the primary material. Additional materials and processes for switching elements are described in U.S. Pat. Nos. 8,415,652 and 8,455,852, each of which is incorporated herein by reference in its entirety.

The barrier element can be formed using, e.g., a non-oxygen chalcogen source. In particular embodiments, the resistance-switching element includes a transition metal M, and the barrier element includes $M_aX_b$, where M is the transition metal present in the resistance-switching element; X is a chalcogen selected from S, Se, or Te; and each of a and b is, independently, an integer of from 1 to 5.

The barrier element can be formed by any useful process. For example, the surface of the resistive switchable element can be treated with a chalcogen source, e.g., any herein, in vapor form. In another example, the surface of the resistive switchable element can be treated with a transition metal layer, which is then treated with a chalcogen source.

The components of the device can be formed by any useful process. Exemplary processes include reactive sputtering, sputtering, chemical vapor deposition (CVD), pulse laser deposition (PLD), atomic layer deposition (ALD), gas cluster ion beam (e.g., as described in U.S. Pub. No. 2012/0104347, which is incorporated herein by reference in its entirety), photolithography, lift-off, etching, electron beam lithography, spin coating, dip coating, spraying, roller coating, electroplating, etc. As those skilled in the art will appreciate, various alternative deposition methods may be useful in this regard, which collectively include sputtering, CVD, atomic layer deposition (ALD), and evaporation. Additional processes and materials are described in U.S. Pat. No. 7,129,133, which is incorporated herein by reference in its entirety.

Further, various methods are available for testing and studying memristive devices, where exemplary parameters include uniformity, endurance, retention, and multibit operation. These parameters can be tested by any useful method, including measuring cycle-to-cycle temporal fluctuations in resistance switching, measuring device-to-device spatial fluctuations in resistance switching, obtaining the change in HRS resistance, extrapolating resistance evolution from measured resistance to read pulses, as well as any described in Wong H S P et al., "Metal-oxide RRAM," *Proc. IEEE* 2012 June; 100(6):1951-70 and Mehonic A et al., "Electrically tailored resistance switching in silicon oxide," *Nanotechnology* 2012; 23:455201 (9 pp.), each of which is incorporated herein by reference in its entirety.

Barrier Element

The barrier element (e.g., as a layer) can include any useful material. In some embodiments, the barrier element includes $M_aX_b$, where M is a transition metal (e.g., a metal present in the resistance-switching element); X is a chalcogen selected from S, Se, or Te; and each of a and b is, independently, an integer of from 1 to 5. In other embodiments, the barrier element includes $MX_2$, where M is a transition metal present in the switchable layer (e.g., any in groups IV-X, such as Ti, Zr, Hf, V, Nb, Ta, Mo, W, Tc, Re, Co, Rh, Ir, Ni, Pd, or Pt), and X is S, Se, or Te. In yet other embodiments, the barrier element includes $M_2X$, where M is a transition metal present in the switchable layer (e.g., any in groups IV-X, such as Ti, Zr, Hf, V, Nb, Ta, Mo, W, Tc, Re, Co, Rh, Ir, Ni, Pd, or Pt), and X is S, Se, or Te.

Other exemplary materials for the barrier element include $TaS_2$, $TaSe_2$, $TaTe_2$, $TiS_2$, $TiSe_2$, $Ti_2S$, $Ti_2Se$, $ZrS_2$, $Zr_2S$, $Zr_2Se$, $HfS_2$, $Hf_2S$, $Hf_2Se$, $VS_2$, $VSe_2$, $MoS_2$, $MoSe_2$, $MoTe_2$, $WS_2$, $WSe_2$, $WTe_2$, $NbS_2$, $NbSe_2$, $RuS_2$, $SnS_2$, $SbSe_2$, $OsS_2$, $PtS_2$, $PdS_2$, $CoS_2$, $Co_9S_8$, $Ni_3S_2$, $Ni_3S_4$, $Fe_7S_8$, or $Bi_2Te_3$, as well as ternary and quaternary forms thereof. In general, a source of the transition metal M is reacted with a chalcogen source (e.g., any herein, including S, Se, $H_2S$, $H_2Se$, $Na_2S$, $CS_2$, $CH_3CSNH_2$, $SC(NH_2)_2$, $SeC(NH_2)_2$, KSCN, $SF_6$, etc.).

Methods of making transition metal chalcogenides include vapor phase reactions of a transition metal halide or transition metal with a chalcogen source (e.g., hydrogen sulfide or an organic chalcogen source, such as hexamethyldisilathiane, di-t-butyldisulfide, di-t-butylsulfide, or t-butylmercaptan); thermal reaction of anhydrous metal sulfates in a $H_2/H_2S$ stream; non-aqueous reactions of anhydrous metal halides with a chalcogen source (e.g., lithium sulfide or ammonium hydrogen sulfide); micromechanical cleaving of transition metal dichalcogenides with adhesive tape; CVD; epitaxial growth; hydrothermal synthesis; dip coating; nanoparticle deposition; electrochemical deposition; and sonochemical preparation, where any of these can be followed by annealing and/or transferring steps, as well as any described in Wold A et al., "Low temperature synthesis of transition metal sulfides," *J. Solid State Chem.* 1992; 96:53-8; Wang S et al., "Synthetic fabrication of nanoscale $MoS_2$-based transition metal sulfides," Materials 2010; 3:401-33; Shimada T et al., "Polytypes and crystallinity of ultrathin epitaxial films of layered materials studied with grazing incidence X-ray diffraction," *Surf. Sci.* 1996; 369:379-84; Keszler D A et al., "New ternary and quaternary transition-metal selenides: Syntheses and characterization," *J. Solid State Chem.* 1985; 57:68-81; Franzen H F et al., "The group IV di-transition metal sulfides and selenides," *Mater. Res. Bull.* 1967; 2:1087-92; Chhowalla M et al., "The chemistry of two-dimensional layered transition metal dichalcogenide nanosheets," Nat. Chem. 2013 April; 5:263-75; and Wang Q H et al., "Electronics and optoelectronics of two-dimensional transition metal dichalcogenides," *Nat. Nanotechnol.* 2012 November; 7:699-712, each of which is incorporated herein by reference in its entirety.

In memristors, the mobile species (e.g., atoms or ions that are exchanged between the resistance-switching dielectric and the reactive electrode) can be a non-oxygen species. In these instances, the barrier element can include any useful material that reduces diffusion of that mobile species. Further, the driving force that moves mobile species across this barrier layer is the applied electric field during the set or reset steps. As a result, the barrier element can include an insulator (e.g., a dielectric) or a semiconductor material that separates the conductive elements (e.g., electrodes) from the resistance-switching element. Exemplary materials include silicon dioxide, silicon nitride, etc.

Resistance-Switching Element

The memristive devices of the invention can include any useful resistance-switching element, such as those including an insulating material. Exemplary insulating materials include transition metal oxide (TMO) films containing mobile oxygen ions, metal cations, and/or oxygen vacancies, such as $TiO_2$, $Ta_2O_5$, $WO_3$, $HfO_2$, $ZrO_2$, $SrTiO_3$, $MoO_3$, NiO, $Al_2O_3$, AlNO, and $Nb_2O_5$, as well as substoichiometric forms of any of these (e.g., $Ta_2O_x$, where x<5). Other materials are described in Yang J J et al., "Memristive devices for computing," *Nat. Nanotechnol.* 2013 January; 8:13-24 and Wong H S P et al., "Metal-oxide RRAM," *Proc. IEEE* 2012 June; 100(6):1951-70, each of which is incorporated herein by reference in its entirety. In some embodiments, the TMO includes sub-stoichiometric amounts of oxygen. In other embodiments, the TMO includes a gradient of oxygen concentration or added dopants, such as Al in $HfO_x$.

In other embodiments, the resistance-switching element includes a non-oxide material (e.g., aluminum nitride). For instance, the memristor can include an aluminum nitride resistance-switching element disposed between an inert electrode (e.g., Pt electrode) and a reactive electrode (e.g., Al or Ti electrode), in which the mobile species is a nitrogen atom. For such non-oxide materials, the barrier element can include any useful material that deters the movement of nitrogen atoms.

In yet other embodiments, the resistance-switching element includes a dielectric, and the memristor relies on mobile metal ions (e.g., Cu++ or Ag+ ions) from a metal electrode disposed on the dielectric. In some instances, a metal filament forms a low resistance path. Exemplary memristors include electro-chemical RRAM, such as silver-doped metal chalcogenides (e.g., germanium selenide), and metal-doped organic compounds.

Tantalum oxide memristors are of particular interest because in some experiments they have exhibited switching at gigahertz rates and above and endurances of more than $10^{12}$ switching cycles. The great endurance of these devices has been attributed to the simple oxide phase diagram of $TaO_x$, which includes only the thermodynamically stable states consisting of metallic tantalum and the insulating oxide $Ta_2O_5$. Because of the simple phase properties, tantalum oxide is also expected to have a relatively simple microscopic mechanism that underlies its resistance-switching behavior.

The resistance-switching element can be formed from any useful material, e.g., any described herein. The thickness of this element can be, e.g., of from about 10 nm to about 50 nm. An exemplary, non-limiting upper limit for the effective range might depend on the method for introducing oxygen to the switching element. If the oxygen is introduced by way of surface oxidation only, we believe an upper limit would be about 100 nm. For film thicknesses above this range, switching to a low-resistance state may be unfeasible. However, effective layers having still greater thicknesses may be achievable using other methods of oxygen introduction.

Conductive Element

The conductive element can have any useful form (e.g., a layer). In particular, the conductive element serves as an electrode and is typically made from electrically conductive metals (e.g., tungsten (W), tungsten nitride (WN), gold (Au), silver (Ag), copper (Cu), chromium (Cr), platinum (Pt), iridium (Ir), nickel (Ni), silicon (Si), molybdenum (Mo), cobalt (Co), ruthenium (Ru), titanium (Ti), titanium nitride (TiN), titanium aluminum nitride (TiAlN), aluminum (Al), hafnium (Hf), strontium (Sr), tantalum (Ta), and tantalum nitride (TaN), as well as doped forms, alloy forms, amorphous forms, crystalline forms, and laminated forms thereof).

In many instances, pairs of conductive elements are employed in the device. In particular embodiments, a pair of metals is favored for the respective electrodes, in which one metal more readily reduces the insulator material than the other. Exemplary electrode pairs include an active electrode formed from an electrochemically active or oxygen reactive material (e.g., Ti) and an inert electrode formed from an electrochemically inert material (e.g., Pt). Other non-limiting electrochemically active or oxygen reactive materials include Ag, Cu, Ni, Ta, Hf, Ti, Sr, or alloys and combined forms thereof, such as CuTe, $SrRuO_3$, or TiN; and electrochemically inert materials include W, Pt, Au, Mo, Co, Cr, Ru, Ir, doped poly-Si, TiW, TiN, or TaN.

The electrodes can have any useful arrangement. Exemplary electrodes include planar electrode(s), a crossbar array of electrodes, and floating electrode(s), as well as combinations thereof. Other exemplary electrode materials and arrangements are described in U.S. Pat. No. 8,415,652 and U.S. Pub. No. 2013/0221307, each of which is incorporated by reference in its entirety.

Uses

The devices of the invention can be employed in any useful manner. Exemplary uses include switches, unit cells (e.g., a memory unit cell), memory (e.g., reconfigurable memory, random access memory, or flash memory, as well as other memory storage forms), logic circuits, logic functions, etc., as well as arrays thereof. In particular embodiments, an array of memristive devices is integrated with CMOS components (e.g., gates, sources, drains, interconnects, vias, lines, semiconductor substrates, and/or contact plugs) to form a RRAM device. Exemplary integration materials and processes are described in U.S. Pub. No. 2012/0104347, which is incorporated herein by reference in its entirety.

Figure 6:
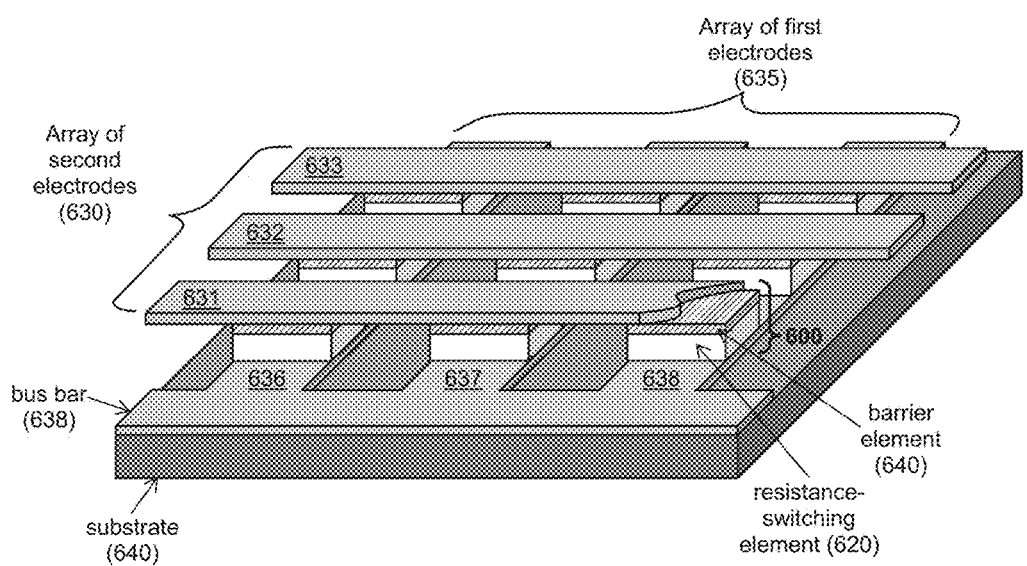
FIG. 6 illustrates an exemplary array including a plurality of memristive devices on a substrate.

FIG. 6 provides an exemplary array including a plurality of memristive devices on a substrate 640, where each device 600 has a barrier element 640, a resistance-switching element 620, a first conductive element including a portion of a first electrode 638, and a second conductive element including a portion of a second electrode 631 (shown as a cut-away section in FIG. 6 to show other elements).

The array also includes an array 630 of second electrodes 631-633, and an array 635 of first electrodes 636-638. As can be seen, the intersection between the electrode arrays (e.g., an intersection between second electrode 631 and first electrode 638, as well as intersection between any one second electrode 631-633 with any one first electrode 636-638) provides the conductive elements for two-terminal connections of the active region. Each active region, in turn, includes a barrier element 640 and a resistance-switching element 620. In such an array, a dielectric (e.g., any herein, such as $SiO_2$) can be included in the each area between and/or surrounding the active regions. Optionally, one or more bus bars 638 can electrically connect an array of electrodes.

In some embodiments, an array can include any other useful component, such as decoders (e.g., word line decoders and bit line decoders), sense amplifiers, output buffers, drivers (e.g., read and write drivers), lines (e.g., bit lines and source lines), selectors (e.g., MOSFETs, bipolar junction transistors, oxide-based diodes, a metal-insulator-transition switches, ovonic threshold switches, etc.), gates, sources, drains, plugs (e.g., conductive plugs disposed within vias), vias, dielectric layers, and/or diodes (e.g., PN junction diodes, Schottky diodes, etc. in any useful arrangement, such as a series arrangement with one or more memristive devices). In particular embodiments, devices for any of these uses can be fabricated back-end-of-the-line in the CMOS fabrication line. Other non-limiting uses and arrays are described in U.S. Pat. No. 8,575,585; Wong H S P et al., "Metal-oxide RRAM," *Proc. IEEE* 2012 June; 100(6):1951-70; and Lee M J et al., "A fast, high-endurance and scalable non-volatile memory device made from asymmetric $Ta_2O_{5-x}/TaO_{2-x}$ bilayer structures," *Nat. Mater.* 2011 August; 10:625-30, each of which is incorporated herein by reference in its entirety.

In some embodiments, the barrier element can be used to reduce noise. Random telegraph noise can be detected in memristors or RRAM device, when it is read at low voltage. Some of this noise may stem from mobile species moving freely between the reactive electrode (e.g., Ti) and the resistance switching element (e.g., a metal oxide resistance switching layer), thus changing the resistance of the filament. Some of the noise can arise from charging and discharging electron-traps near the filament, which in turn stem from oxygen atoms that move in and change the environment of the filament. The proposed barrier element in this invention is designed to reduce movement of mobile species and thus, can be useful for reducing, suppressing, or stabilizing random telegraph noise.

EXAMPLE

Example 1: Enhancing Reliability of Resistive-Memory/Memristive Devices

Most currently investigated resistive memory/memristor devices are comprised of a transition metal oxide (TMO) sandwiched between metallic electrodes, one of which includes a reactive metal to form an active electrode. Switching involves the formation of oxygen vacancies in the dielectric by oxygen transfer into the active metal electrode. All current switching models involve the formation of oxygen vacancies in the dielectric film by oxygen atom drift and diffusion into or from the active metal electrode.

Resistive memory is considered to have low energy consumption for read/write operations, partially because of no, or very low barrier for that oxygen transfer step. However, the lack of an energy barrier also gives rise to the very low reliability (e.g., low endurance and state retention) observed in these devices so far.

To provide enhanced reliability, the present invention includes the use of transition metal chalcogenides (e.g., dichalcogenides) to form a stable, semiconducting barrier element between the resistance-switching element and the active electrode. For example, most transition metals form strong bonds with chalcogenides such as sulfur, which are not easily replaced by bonds to oxygen or displaced by oxygen. In particular, most transition metal dichalcogenides, such as $MoSe_2$ or $TaS_2$, are very stable, semiconducting, layered compounds that can be grown and exist stably as a single monolayer (e.g., like graphene) on the transition metal oxide film.

The barrier element can have any useful form. In one non-limiting example, one or a few such laterally continuous monolayers can be grown between the TMO film and the active metal electrode. Such monolayer(s) should create a sufficient and controlled energy barrier for oxygen atom/ion drift.

Figures 3, 4, 5:
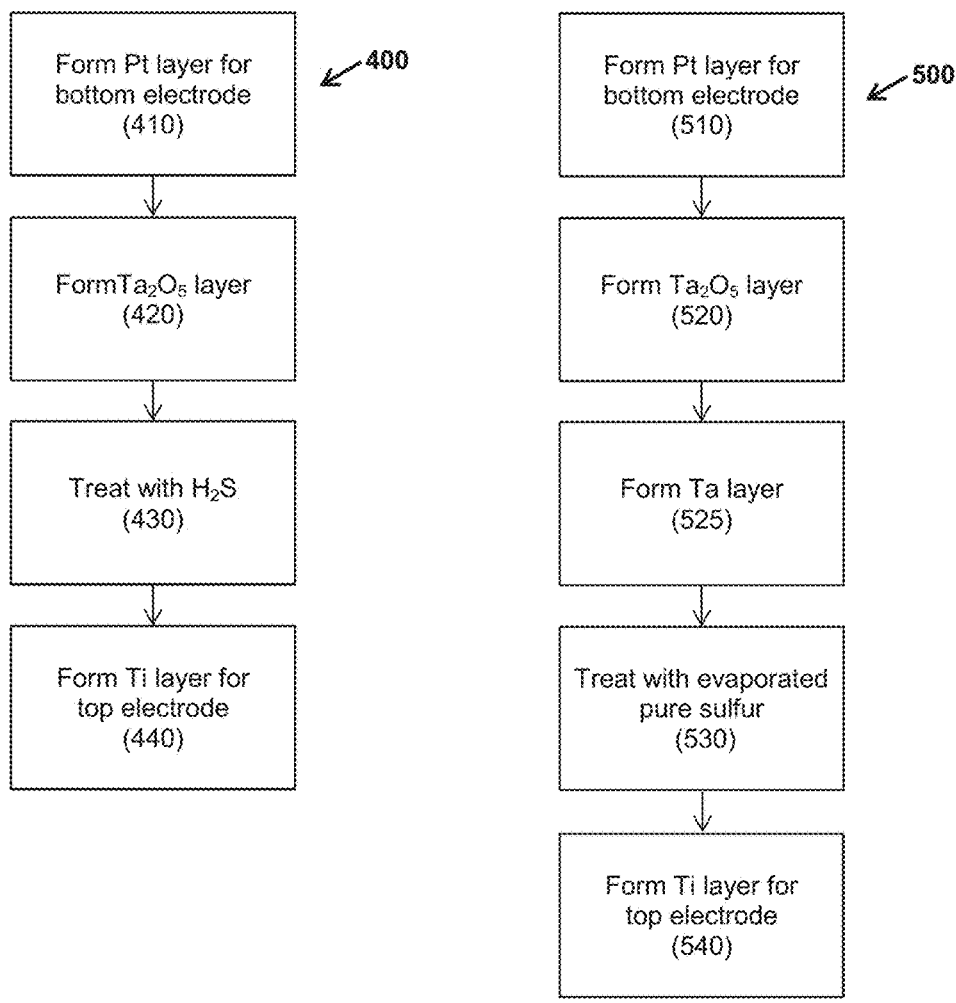
FIG. 3 is a schematic of an exemplary memristive device 300 having a $TaS_2$ barrier layer 310 and a $Ta_2O_5$ switching layer 320 disposed between two electrodes 330, 335.
FIG. 4 is a schematic of an exemplary method 400 for forming a memristive device using $H_2S$ as a chalcogen source 430 to form the $TaS_2$ barrier layer.
FIG. 5 is a schematic of an exemplary method 500 for forming a memristive device using pure sulfur as a chalcogen source 530 to form the $TaS_2$ barrier layer.

As shown in FIG. 3, an exemplary memristive device 300 includes a $Pt/Ta_2O_5/Ti$ stack. In this stack, the Pt layer 335 forms the inactive electrode, the $Ta_2O_5$ layer 320 is the TMO resistance-switching layer, and the Ti layer 330 forms the active electrode. The barrier element 310 is generally formed between the resistance-switching layer and the active electrode. In some embodiments, the barrier element includes the transition metal present in the resistance-switching layer. Thus, for this non-limiting stack, the barrier element can include $TaS_2$ or $TaSe_2$.

The barrier element can be formed in any useful manner. Taking the $Pt/Ta_2O_5/Ti$ stack as a non-limiting example, the method 400 in FIG. 4 includes forming the Pt layer for the bottom electrode 410. After $Ta_2O_5$ deposition 420, $H_2S$ treatment 430 can be used to form an ordered $TaS_2$ layer. Then, a Ti layer is formed for the top electrode 440.

In an alternative method, the barrier element can be formed in two steps. For example, one can evaporate pure chalcogen (e.g., S) on the resistance-switching element dielectric prior to transition metal (e.g., Ta) deposition at higher temperature, and the chalcogen will readily react with the metal vapor. As shown in FIG. 5, the method 500 can include forming a Pt layer for the bottom electrode 510 and forming the $Ta_2O_5$ layer 520. To form the barrier element, two steps are required, including forming a Ta layer on the Ta$_2$O$_5$ layer 525 and subsequently treating with evaporated pure sulfur 530 to form the TaS$_2$ barrier layer. Finally, a Ti layer is formed for the top electrode 540.

Other Embodiments

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A device comprising:
   a first conductive element and a second conductive element, the second conductive element being an active conductive element exhibiting a high oxygen affinity;
   a resistance-switching element disposed between the first and second conductive elements, wherein the resistance-switching element includes a transition metal-oxide film containing mobile oxygen ions to provide switching through their movement toward the second conductive element; and
   a barrier element disposed between the second conductive element and the resistance-switching element to reduce diffusion of mobile oxygen ions therebetween,
   wherein the barrier element comprises M$_a$X$_b$, M is a transition metal present in the resistance-switching element, X is a chalcogen selected from S or Se, and each of a and b is, independently, an integer of from 1 to 5.

2. The device of claim 1, wherein the second conductive element comprises an active electrode of Al or Ti.

3. The device of claim 1, wherein the barrier element comprises TaS$_2$, MoS$_2$, MoSe$_2$, or WS$_2$.

4. The device of claim 3, wherein the resistance-switching element comprises M$_c$O$_d$, M is a transition metal, and each of c and d is, independently, an integer of from 1 to 5.

5. The device of claim 4, wherein M is selected from the group consisting of Ta, W, Nb, Mo, Ti, and Co.

6. The device of claim 2, wherein the barrier element is configured to be in conductive electrical contact with both the active electrode and the resistance-switching element upon activation of the device.

7. The device of claim 1, wherein the first conductive element is sufficiently parallel with the second conductive element.

8. The device of claim 7, wherein the first conductive element comprises an inert electrode.

9. An array comprising a plurality of devices of claim 1.

10. The array of claim 9, wherein the plurality of first conductive elements forms an array of first electrodes and the plurality of second conductive elements forms an array of second electrodes.

* * * * *